(12) United States Patent
Frannhagen

(10) Patent No.: US 6,868,529 B1
(45) Date of Patent: Mar. 15, 2005

(54) METHOD AND APPARATUS FOR EFFICIENT IMPLEMENTATION OF ROUND ROBIN CONTROL UNIT

(75) Inventor: Mats Frannhagen, Greenbrae, CA (US)

(73) Assignee: Turin Networks, Petaluma, CA (US)

( * ) Notice: Subject to any disclaimer, the term of this patent is extended or adjusted under 35 U.S.C. 154(b) by 89 days.

(21) Appl. No.: 09/945,050

(22) Filed: Aug. 31, 2001

(51) Int. Cl.$^7$ .............................................. G06F 17/50
(52) U.S. Cl. .............................. 716/1; 716/12; 716/13; 716/14
(58) Field of Search ................................ 716/1, 12–14; 710/33–40, 107–111, 305–309; 712/10, 15, 29, 31

(56) References Cited

U.S. PATENT DOCUMENTS

| | | | |
|---|---|---|---|
| 5,095,460 A | * | 3/1992 | Rodeheffer ................ 709/103 |
| 5,274,785 A | | 12/1993 | Kuddes et al. |
| 5,357,512 A | | 10/1994 | Khaira et al. |
| 5,519,837 A | | 5/1996 | Tran |
| 5,568,485 A | * | 10/1996 | Chaisemartin ............. 370/462 |
| 6,467,009 B1 | * | 10/2002 | Winegarden et al. ....... 710/305 |
| 6,516,369 B1 | * | 2/2003 | Bredin ....................... 710/111 |
| 6,647,449 B1 | * | 11/2003 | Watts ........................ 710/111 |

OTHER PUBLICATIONS

Lee, K.C., "A variable round–robin arbiter for high speed buses and statistical multiplexers", Tenth Annual International Phoenix Conference on Mar. 27–30, 1991. Page(s): 23–29.*

Hurt, J, et al. "Design and implementation of high–speed symmetric crossbar schedulers", IEEE International Conference on , vol.: 3 , Jun. 6–10, 1999. Page(s): 1478–1483.*

Bhagwan, R.et al., "Design of a high–speed packet switch with fine–grained quality–of–service guarantees", IEEE International Conference on ,vol.: 3 , Jun. 18–22, 2000. Page(s): 1430–1434.*

Emer, J., et al., "A Language for Describing Predictors and its Application to Automatic Synthesis,", IEEE, 1997, pp. 304–314.*

Faisstnauer, C.; Schmalstieg, D.; Purgathofer, W.; "Priority round–robin scheduling for very large virtual environments-",Virtual Reality, 2000. Proceedings. IEEE, Mar. 18–22, 2000, Page(s): 135–142.*

\* cited by examiner

Primary Examiner—Vuthe Siek
Assistant Examiner—Naum Levin
(74) Attorney, Agent, or Firm—Blakely, Sokoloff, Taylor & Zafman LLP

(57) ABSTRACT

An apparatus is described having a plurality of grant generation units. The plurality of grant generation units are arranged according to a round robin grant eligibility hierarchy, such that, one grant generation unit exists for each of a plurality of request agents. A grant generation unit is chosen to provide an output specifying which request agent, from the plurality of request agents is to receive a grant. The chosen grant generation unit is chosen because its corresponding request agent is the next request agent in the round robin grant eligibility hierarchy to be recognized as being eligible for a grant.

56 Claims, 14 Drawing Sheets

```
module rr (dataIn, state, dataOut) /* synthesis syn_hier =
"flatten,remove" */;
input [19:0]        dataIn;
input [19:0]        state;
output [19:0]       dataOut;

wire[19:0]  dataOut0, dataOut1, dataOut2, dataOut3, dataOut4,
            dataOut5, dataOut6, dataOut7, dataOut8, dataOut9,
            dataOut10, dataOut11, dataOut12, dataOut13, dataOut14,
            dataOut15, dataOut16, dataOut17, dataOut18, dataOut19, prio prio0 (.dataIn(dataIn), .en(state[19]),
            .dataOut(dataOut0));                                    700 prio prio1 (.dataIn({dataIn[0], dataIn[19:1]}), .en(state[0]),
            .dataOut({dataOut1[0], dataOut1[19:1]}));

prio prio2 (.dataIn({dataIn[1:0], dataIn[19:2]}), .en(state[1]),
            .dataOut({dataOut2[1:0], dataOut2[19:2]}));

prio prio3 (.dataIn({dataIn[2:0], dataIn[19:3]}), .en(state[2]),
            .dataOut({dataOut3[2:0], dataOut3[19:3]}));

prio prio4 (.dataIn({dataIn[3:0], dataIn[19:4]}), .en(state[3]),
            .dataOut({dataOut4[3:0], dataOut4[19:4]}));

prio prio5 (.dataIn({dataIn[4:0], dataIn[19:5]}), .en(state[4]),
            .dataOut({dataOut5[4:0], dataOut5[19:5]}));

prio prio6 (.dataIn({dataIn[5:0], dataIn[19:6]}), .en(state[5]),
            .dataOut({dataOut6[5:0], dataOut6[19:6]}));

prio prio7 (.dataIn({dataIn[6:0], dataIn[19:7]}), .en(state[6]),
            .dataOut({dataOut7[6:0], dataOut7[19:7]}));

prio prio8 (.dataIn({dataIn[7:0], dataIn[19:8]}), .en(state[7]),
            .dataOut({dataOut8[7:0], dataOut8[19:8]}));

prio prio9 (.dataIn({dataIn[8:0], dataIn[19:9]}), .en(state[8]),
            .dataOut({dataOut9[8:0], dataOut9[19:9]}));

prio prio10 (.dataIn({dataIn[9:0], dataIn[19:10]}), .en(state[9]),
            .dataOut({dataOut10[9:0], dataOut10[19:10]}));
```

702 (brace grouping the prio0–prio10 instantiations)

702 {
```
prio prio11 (.dataIn({dataIn[10:0], dataIn[19:11]}), .en(state[10]),
        .dataOut({dataOut11[10:0], dataOut11[19:11]}));

prio prio12 (.dataIn({dataIn[11:0], dataIn[19:12]}), .en(state[11]),
        .dataOut({dataOut12[11:0], dataOut12[19:12]}));

prio prio13 (.dataIn({dataIn[12:0], dataIn[19:13]}), .en(state[12]),
        .dataOut({dataOut13[12:0], dataOut13[19:13]}));

prio prio14 (.dataIn({dataIn[13:0], dataIn[19:14]}), .en(state[13]),
        .dataOut({dataOut14[13:0], dataOut14[19:14]}));

prio prio15 (.dataIn({dataIn[14:0], dataIn[19:15]}), .en(state[14]),
        .dataOut({dataOut15[14:0], dataOut15[19:15]}));

prio prio16 (.dataIn({dataIn[15:0], dataIn[19:16]}), .en(state[15]),
        .dataOut({dataOut16[15:0], dataOut16[19:16]}));

prio prio17 (.dataIn({dataIn[16:0], dataIn[19:17]}), .en(state[16]),
        .dataOut({dataOut17[16:0], dataOut17[19:17]}));

prio prio18 (.dataIn({dataIn[17:0], dataIn[19:18]}), .en(state[17]),
        .dataOut({dataOut18[17:0], dataOut18[19:18]}));

prio prio19 (.dataIn({dataIn[18:0], dataIn[19]}), .en(state[18]),
        .dataOut({dataOut19[18:0], dataOut19[19]}));
```

703 →
```
assign dataOut = ((dataOut0 | dataOut1 | dataOut2 | dataOut3 |
        (dataOut4 | dataOut5 | dataOut6 | dataOut7 |
        (dataOut8 | dataOut9 | dataOut10 | dataOut11 |
        (dataOut12 | dataOut13 | dataOut14 | dataOut15 |
        (dataOut16 | dataOut17 | dataOut18 | dataOut19));
endmodule // rr
```

FIG. 7 (Cont.)

```
module prio (dataIn, en, dataOut);
input [19:0] dataIn;
input        en;
Output[19:0] dataOut;
reg [19:0]   i_dataOut0;
always @(/*AUTOSENSE*/dataIn) begin
  i_dataOut0 = 20'd0;
  if       (dataIn[0])   i_dataOut0 = 20'h00001;
  else if (dataIn[1])   i_dataOut0 = 20'h00002;
  else if (dataIn[2])   i_dataOut0 = 20'h00004;
  else if (dataIn[3])   i_dataOut0 = 20'h00008;
  else if (dataIn[4])   i_dataOut0 = 20'h00010;
  else if (dataIn[5])   i_dataOut0 = 20'h00020;
  else if (dataIn[6])   i_dataOut0 = 20'h00040;
  else if (dataIn[7])   i_dataOut0 = 20'h00080;
  else if (dataIn[8])   i_dataOut0 = 20'h00100;
  else if (dataIn[9])   i_dataOut0 = 20'h00200;
  else if (dataIn[10])  i_dataOut0 = 20'h00400;
  else if (dataIn[11])  i_dataOut0 = 20'h00800;
  else if (dataIn[12])  i_dataOut0 = 20'h01000;
  else if (dataIn[13])  i_dataOut0 = 20'h02000;
  else if (dataIn[14])  i_dataOut0 = 20'h04000;
  else if (dataIn[15])  i_dataOut0 = 20'h08000;
  else if (dataIn[16])  i_dataOut0 = 20'h10000;
  else if (dataIn[17])  i_dataOut0 = 20'h20000;
  else if (dataIn[18])  i_dataOut0 = 20'h40000;
  else if (dataIn[19])  i_dataOut0 = 20'h80000;
end assign dataOut = {20{en}} & i_dataOut0;

endmodule // prio
```

```
module prio      (dataIn, en, dataOut); /* synthesis syn_hier = "flatten,remove" */;
input [19:0]     dataIn;
input            en;
output [19:0]    dataOut;

reg [4:0]        i_dataOut0;
reg [4:0]        i_dataOut1;
reg [4:0]        i_dataOut2;
reg [4:0]        i_dataOut3;
wire [9:0]       i_dataOut4;
wire [9:0]       i_dataOut5;

wire             muxCt11;
wire             muxCt12;
wire             muxCt13;

// Calc in parallel
assign muxCt11 = |dataIn[4:0];
assign muxCt12 = |dataIn[14:10];
assign muxCt13 = |dataIn[9:5] | muxCt11;
```

FIG. 9

```
always @(/* AUTOSENSE*/dataIn) begin
  i_dataOut0 = 5'd0;
  if (dataIn[0])      i_dataOut0 = 5'h01;
  else if(dataIn[1])  i_dataOut0 = 5'h02;
  else if(dataIn[2])  i_dataOut0 = 5'h04;
  else if(dataIn[3])  i_dataOut0 = 5'h08;
  else if(dataIn[4])  i_dataOut0 = 5'h10;
end // always @ (...
```
⎫
⎬ 901
⎭

```
always @(/* AUTOSENSE*/dataIn) begin
  i_dataOut1 = 5'd0;
  if (dataIn[5])      i_dataOut1 = 5'h01;
  else if(dataIn[6])  i_dataOut1 = 5'h02;
  else if(dataIn[7])  i_dataOut1 = 5'h04;
  else if(dataIn[8])  i_dataOut1 = 5'h08;
  else if(dataIn[9])  i_dataOut1 = 5'h10;
end // always @ (...
```
⎫
⎬ 902
⎭

```
always @(/* AUTOSENSE*/dataIn) begin
  i_dataOut2 = 5'd0;
  if (dataIn[10])     i_dataOut2 = 5'h01;
  else if(dataIn[11]) i_dataOut2 = 5'h02;
  else if(dataIn[12]) i_dataOut2 = 5'h04;
  else if(dataIn[13]) i_dataOut2 = 5'h08;
  else if(dataIn[14]) i_dataOut2 = 5'h10;
end // always @ (...
```
⎫
⎬ 903
⎭

FIG. 9 (Cont.)

```
always @(/* AUTOSENSE */ dataIn) begin
  i_dataOut3 = 5'd0;
  if (dataIn[15])      i_dataOut3 = 5'h01;
  else if(dataIn[16])  i_dataOut3 = 5'h02;
  else if(dataIn[17])  i_dataOut3 = 5'h04;
  else if(dataIn[18])  i_dataOut3 = 5'h08;
  else if(dataIn[19])  i_dataOut3 = 5'h10;
end // always @ (...
```
⎫
⎬ 904
⎭

```
// "Mux" data out
assign i_dataOut4 = {i_dataOut1 & {5{-muxCt11}}, i_dataOut0 & {5{muxCt11}}};
assign i_dataOut5 = {i_dataOut3 & {5{-muxCt12}}, i_dataOut2 & {5{muxCt12}}};
assign dataOut = {dataOut5 & {10{en & -muxCt13}}, i_dataOut4 & {10{en & muxCt13}}};

endmodule // prio
```
905 →

METHOD AND APPARATUS FOR EFFICIENT IMPLEMENTATION OF ROUND ROBIN CONTROL UNIT

FIELD OF INVENTION

The field of invention relates to electronic circuit design, generally; and, more specifically, to a method and apparatus for the efficient implementation of a round robin control unit.

BACKGROUND

FIG. 1 shows n queues $101_0$ through $101_{n-1}$. If the output traffic from each of the n queues $101_0$ through $101_{n-1}$ is designed to flow through a channel 102 having a limited amount of bandwidth resources, in typical applications, the simultaneous emission of output traffic from each of the n queues $101_0$ through $101_{n-1}$ "overloads" the bandwidth resources of the channel 102. That is, more traffic is offered to the channel 102 than it can handle. In order to prevent the overload of the channel 102, the total output traffic from all of the queues $101_0$ through $101_{n-1}$ i is throttled back causing traffic to build up within the queues $101_0$ through $101_{n-1}$.

As such, the queues $101_0$ through $101_{n-1}$ may be said to "contend" for the bandwidth resources of the channel 102— in the sense that their traffic build-up causes them to desire the use of the channel 102. In order to implement the throttling back of total traffic from all of the queues $101_0$ through $101_{n-1}$, for example, one of the queues may be given permission (i.e., a "grant") to release a flow of output traffic while some or all of the other queues are forced to hold theirs.

By distributing these grants to the queues $101_0$ through $101_{n-1}$ in a fair manner, each queue will eventually be given a grant to release its output traffic. As such, the total flow of traffic from all of the queues $101_0$ through $101_{n-1}$ is throttled back (e.g., so as to be commensurate with the bandwidth of the channel 102) and each of the queues $101_0$ through $101_{n-1}$ has an opportunity to transmit. This corresponds to a fair resolution of the contention for the resources of the channel 102.

A technique referred to as "round robin" may be used to implement a fair resolution for the contention of resources. In a round robin approach, queues are issued grants in a cyclical fashion. That is, for example, if each of the n queues $101_0$ through $101_{n-1}$ has traffic to release: queue $101_0$ is given a first grant; queue $101_1$ is given a second grant; . . . ; queue $101_n-1$ is given an $n^{th}$ grant; queue $101_0$ is given an $(n+1)^{th}$ grant; queue $101_1$ is given an $(n+2)^{th}$ grant; . . . ; queue $101_{n-1}$ is given a $(2n)^{th}$ grant; etc.,.

If a queue is "empty" (i.e., does not have traffic to send) when its turn arises to receive a grant, the robin robin mechanism "skips over" the empty queue and issues the next grant to the next queue in the cycle having traffic to release. For example, if queue $101_1$ is empty after queue $101_0$ is given a grant, queue $101_2$ is given the "next" grant (after the grant given to queue $101_0$) if queue $101_2$ has traffic to release. If queue $101_2$ does not have traffic to release, queue $101_3$ (not shown in FIG. 1) is given the "next" grant if it has traffic to release, etc.

Note that the round robin mechanism may be applied to resource contentions generally. That is, applications other than a group of queues $101_0$ through $101_{n-1}$ that collectively feed a common channel 102 (as seen in FIG. 1) may implement a round robin scheme. For example, common applications of round robin schemes include (among others) the granting of switching or routing resources (e.g., to streams of traffic within a network or networking system), the granting of processing resources (e.g., to applications or clients that use a computing system), etc. Regardless as to the exact environment where a round robin scheme is implemented, the element(s) that contend with one another for a resource (e.g., queues, traffic streams, software applications, client devices) may be referred to in a general way as the "requesting agent(s)".

A problem with round robin schemes, however, is their complexity as the number of contenders "n" (e.g., the n queues $101_0$ through $101_{n-1}$ observed in FIG. 1) increases. As n increases, the round robin controlling mechanism has to "keep track of" more contentions and grants which results in complex and inefficient round robin design implementations.

FIGURES

The present invention is illustrated by way of example, and not limitation, in the figures of the accompanying drawings in which:

FIG. 4 shows an embodiment of the methodology that round robin control unit of FIG. 3a executes according to.

FIG. 7 shows an embodiment of a register transfer level (RTL) description for a round robin control unit.

FIG. 8 shows an embodiment of an RTL description for a grant generation unit.

FIG. 9 shows another embodiment of an RTL level description for a grant generation unit.

DETAILED DESCRIPTION

Discussion of Round Robin Circuit Embodiments

Figure 1:
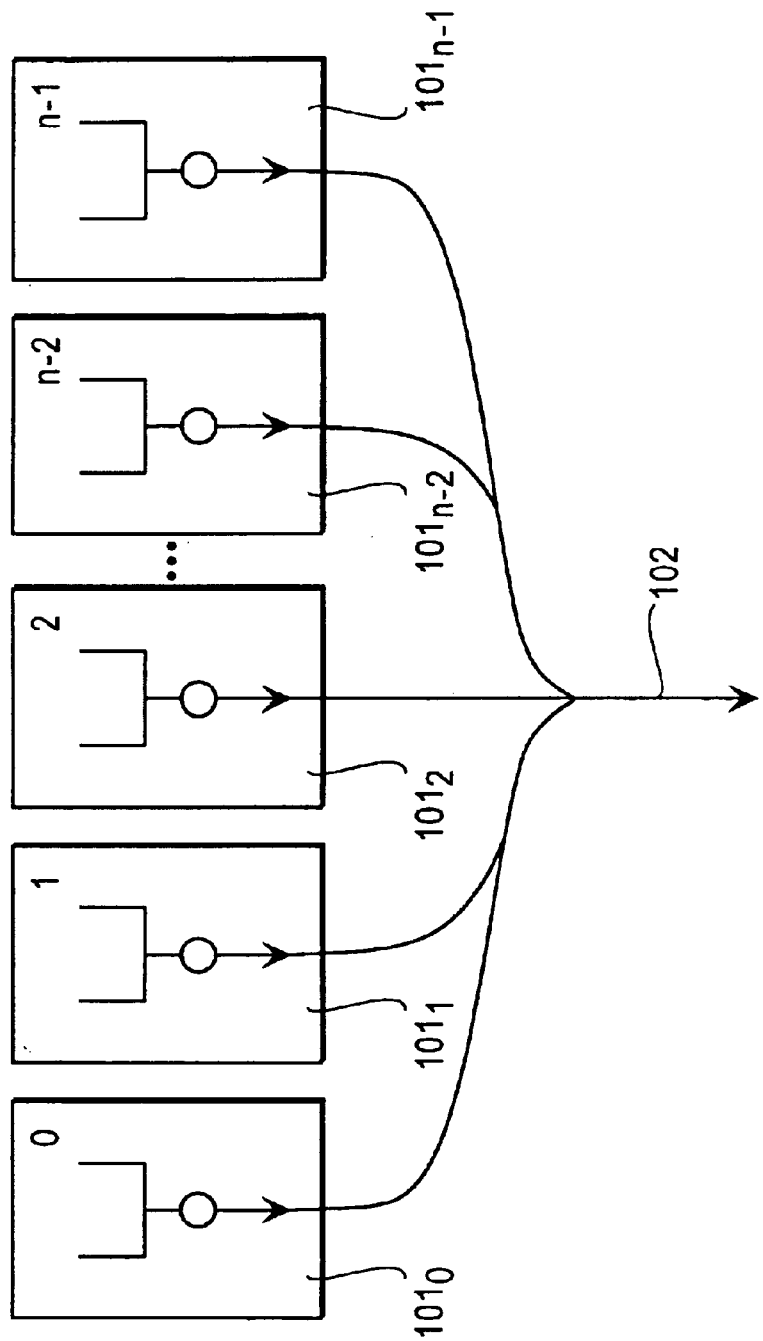
FIG. 1 shows n queues.

Referring to FIG. 1 note that, in a sense, a round robin scheme may be viewed as being organized according to a hierarchy of eligibility for the grants that are issued over the course of a cycle. That is, for example, initially the first queue $101_0$ is first recognized as being eligible for a grant. The remaining queues $101_1$ through $101_{n-1}$ are then recognized as being eligible for a grant in succession (i.e., in order) from the second queue $101_1$ to the last queue $101_{n-1}$.

With regard to the initial recognition of the first queue $101_0$ as being eligible for a grant, if the first queue $101_0$ is non-empty the first queue $101_0$ receives a grant; and, the second queue $101_1$ is next recognized as being eligible for a grant. Alternatively, if the first queue $101_0$ is empty the first queue $101_0$ does not receive a grant; and, the second queue $101_1$ is recognized as being eligible for a grant.

Thus regardless if the first queue $101_0$ is deemed empty or non empty, once the appropriate disposition has been reached as to the grant eligibility of the first queue $101_0$ (i.e., a decision has been made to issue a grant or not to issue a grant to the first queue $101_1$), recognition of grant eligibility passes to the second queue $101_1$ (which is viewed as the next queue in the hierarchy) and a second disposition is reached for the second queue $101_1$ (i.e., a second decision is made to issue a grant or not to issue a grant to the second queue $101_1$).

The process of passing grant eligibility to the next queue in the hierarchy (e.g., from left to right as seen in FIG. 1), and reaching a disposition in response, is continually repeated until a disposition is reached for the last queue $101_{n-1}$ in the heirarchy. Thus, in this case, the round robin cycle can be viewed as the series of processes that extend from: 1) the recognizing of the first queue $101_0$ as being grant eligible; to 2) the reaching of a disposition on the grant eligibility of the last queue $101_{n-1}$. Note that because each queue is recognized as being grant eligible during a round robin cycle, the manner in which grants are issued is fair.

Figure 2:
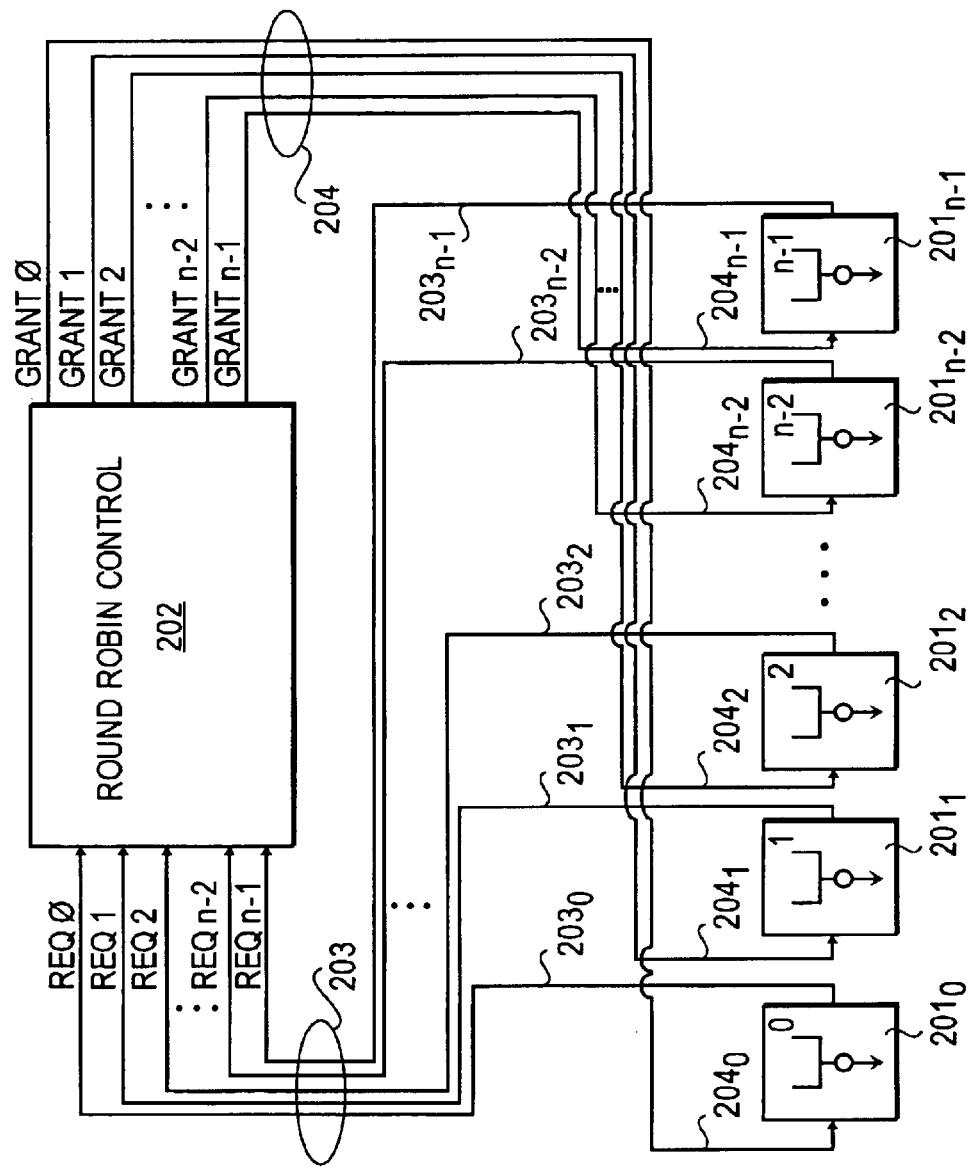
FIG. 2 shows an embodiment of a round robin control unit that manages n queues in a round robin fashion.

FIG. 2 shows an embodiment of a round robin control unit 202 that controls the round robin release of traffic from n queues $201_0$ through $201_{n-1}$. The round robin control unit 202 embodiment of FIG. 2 employs "one hot" encoding to issue individual grants to each of the n queues $201_0$ through $201_{n-1}$. That is, a collection of n output signals 204 from the round robin control unit (shown as Grant_0 through Grant_n-1 in FIG. 2) are used to individually present a grant to each of the n queues $201_0$ through $201_{n-1}$.

For example, if only queue $201_0$ is to be issued a grant, the Grant_0 line $204_0$ is provided an active logic signal by the round robin control unit 202 while the remaining Grant_1 through Grant_n-1 lines $204_1$ through $204_{n-1}$ are provided an inactive logic signal. For example, if positive logic is employed, Grant_0 line $204_0$ is provided with a "1" while the remaining Grant_1 through Grant_n-1 lines $204_1$ through $204_{n-1}$ are provided with a "0". Similarly, if negative logic is employed, Grant_0 line $204_0$ is provided with a "0" while the remaining Grant_1 through Grant_n-1 lines $204_1$ through $204_{n-1}$ are provided with a "1".

If the logic values presented on the collection of round robin control unit output lines 204 are viewed together as a vector, a round robin scheme can be implemented by shifting an active bit within the vector against a field of inactive bits. That is, for example, one "run through" of a round robin cycle (where each of queues $201_0$ through $201_{n-1}$ are issued a grant) can be implemented if a sequence of output vectors:

| | |
|---|---|
| 00...001 | (only Grant_0 line $204_0$ active) |
| 00...010 | (only Grant_1 line $204_1$ active) |
| 00...100 | (only Grant_2 line $204_2$ active) |
| ... | ... |
| 01...000 | (only Grant_n-2 line $204_{n-2}$ active) |
| 10...000 | (only Grant_n-1 line $204_{n-1}$ active) | are provided by the round robin control unit 202 across the grant lines 204.

Note that within the "one-hot" vector structure listed above, the vector bits are ordered in significance in a manner that corresponds with the queues $201_0$ through $201_{n-1}$ themselves. That is, in the embodiment provided above, Grant_0 line $204_0$ corresponds to the least significant bit and Grant_n-1 line $204_{n-1}$ corresponds to the most significant bit. Thus, the embodiment above corresponds to a round robin scheme implementation wherein a "next" grant within a round robin cycle is issued by shifting an active bit to a next higher vector column.

The round robin control unit 202 of FIG. 2 not only provides a "vector" as an output signal across grant lines 204 but also receives a "vector" as an input signal across request lines 203. That is, as seen in FIG. 2, n request lines 203 (labeled as Req_0 $203_0$ through Req_n-1 $203_{n-1}$) are sent to the round robin control unit 202 from queues $201_0$ through $201_{n-1}$. In the embodiment of FIG. 2, a queue that desires to release output traffic (e.g., such as any queue having en-queued information that is waiting to be released) activates its appropriate request line.

That is, if queue $201_0$ desires to release traffic the Req_0 line $203_0$ is activated (e.g., is given an active logic signal); if queue $201_1$ desires to release traffic the Req_1 line $203_1$ is activated; . . . ; and; if queue $201_{n-1}$ desires to release traffic the Req_n-1 line $203_{n-1}$ is activated. Thus, the request lines 203 may be collectively viewed as an input vector (to the round robin control unit 202) that continually changes as traffic is added to and removed from the queues.

That is, when a queue is emptied (e.g., after it has been issued a grant) the request line signal for the queue is changed from active to inactive; and, after an emptied queue becomes non-empty (e.g., just after an emptied queue receives new information for enqueueing) the request line signal for the queue is changed from inactive to active. As each queue in the collection of queues $201_0$ through $201_{n-1}$ changes its state (from empty to non empty or non empty to empty) the input vector to the round robin control unit changes. Note that a queue's state corresponds to whether or not a queue is empty (e.g., the queue may be said to have an empty state or a non empty state).

Note that a single input vector can have more than one active request line. For example, if queues $201_0$ and $202_1$ are simultaneosuly non-empty, an active signal will be presented on request lines Req_0 $203_0$ and Req_1 $203_1$ for as long as these queues $201_0$, $202_1$ remain simultaneously non-empty. Note that, in a sense, multiple active requests within a single input vector may be viewed as a manifestation of the contention for resources. That is, continuing with the example provided just above, if the request lines Req_0 $203_0$ and Req_1 $203_1$ are simultaneosuly activated, their respective queues $201_0$ and $202_1$ are effectively competing with one another for a grant from the round robin control unit 202.

The round robin control unit 202 "decides", in an manner that is consistent with a round robin approach, which of the input vector's active request(s) is to be positively responded to by the issuance of a grant along its corresponding grant line (e.g., if a request on Req_0 line $203_0$ is recognized as being an appropriate round robin selection, grant line Grant_0 $204_0$ is given an active signal). In various embodiments, the round robin control unit 202 may be designed to operate in a synchronous fashion (e.g., by issuing output vectors in pace with a clock signal). The input vectors may also be provided in a synchronous fashion as well. Asynchronous designs are also possible.

Figure 3A:
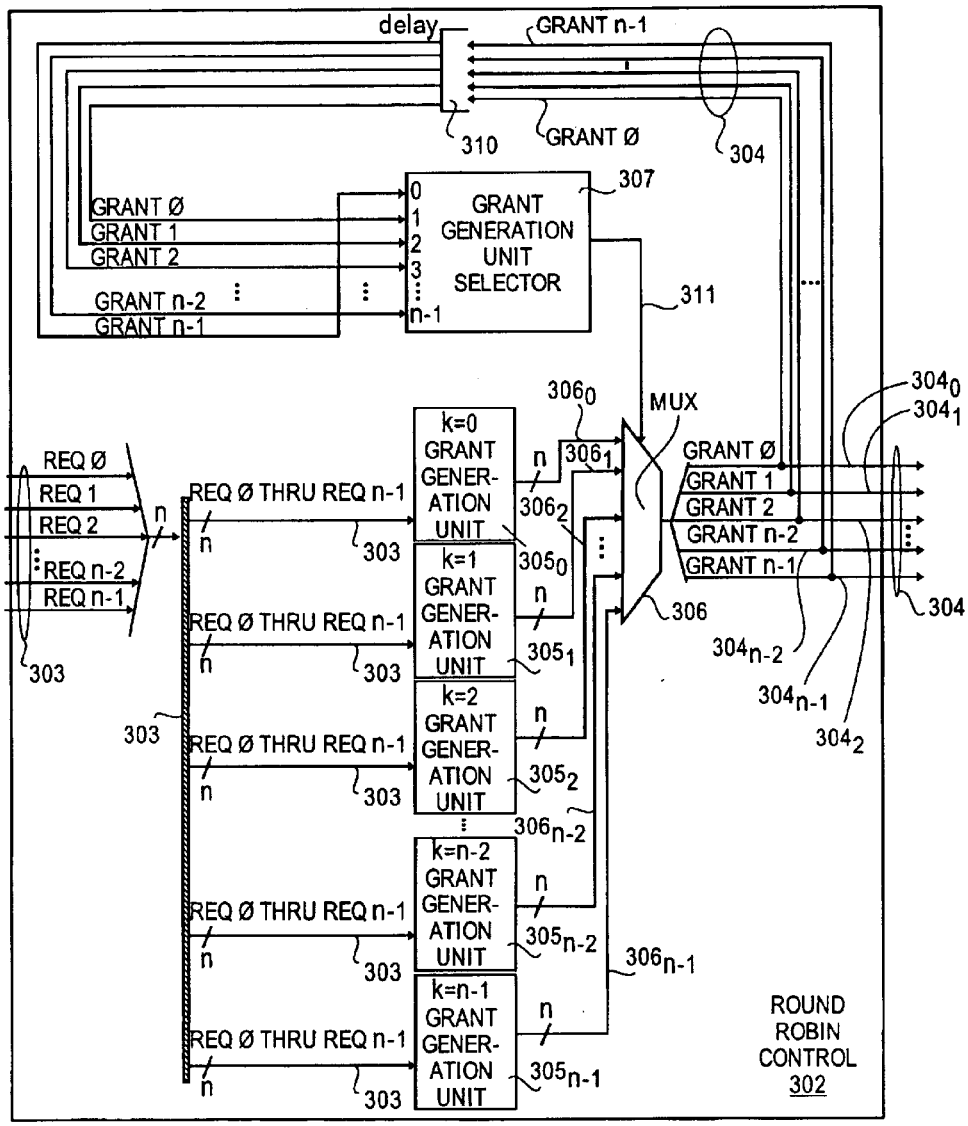
FIG. 3a shows an embodiment of the round robin control unit of FIG. 2.

Note also that, as a more expansive or general depiction, queues $201_0$ through $201_{n-1}$ may be replaced with (or viewed as) "request agents" as discussed in the background (rather than queues). FIG. 3a shows an embodiment 302 of a round robin control unit that may be used for the round robin control unit 202 of FIG. 2. In the depiction of FIG. 3a, grant lines 304 may be viewed as corresponding to grant lines 204 of FIG. 2; and, request lines 303 may be viewed as corresponding to request lines 203 of FIG. 2. Note that the request lines 303 are drawn as a bus-like structure.

As seen in FIG. 3a, the collection of request lines 303 (i.e., Req_0 through Req_n-1) are presented to each of n unique grant generation units $305_0$ through $305_{n-1}$. Each grant generation unit has circuitry capable of generating an entire output vector for presentation across grant lines 304. The particular grant generation unit that is used to provide the round robin control unit 302 output vector 304 corresponds to the request agent being recognized as grant eligible.

That is, if the first request agent is recognized as being grant eligible (e.g., queue $201_0$ in FIG. 2), the first (k=0) grant generation unit $305_0$ provides the output vector 304 of the round robin control unit; if the second request agent is recognized as being grant eligible (e.g., queue $201_1$ in FIG. 2), the second (k=1) grant generation unit $305_1$ provides the output vector 304 of the round robin control unit; . . . ; and if the last request agent is recognized as being grant eligible (e.g., queue $201_{n-1}$ in FIG. 2), the last (k=n-1) grant generation unit $305_{n-1}$ provides the output vector 304 of the round robin control unit.

Figure 4:
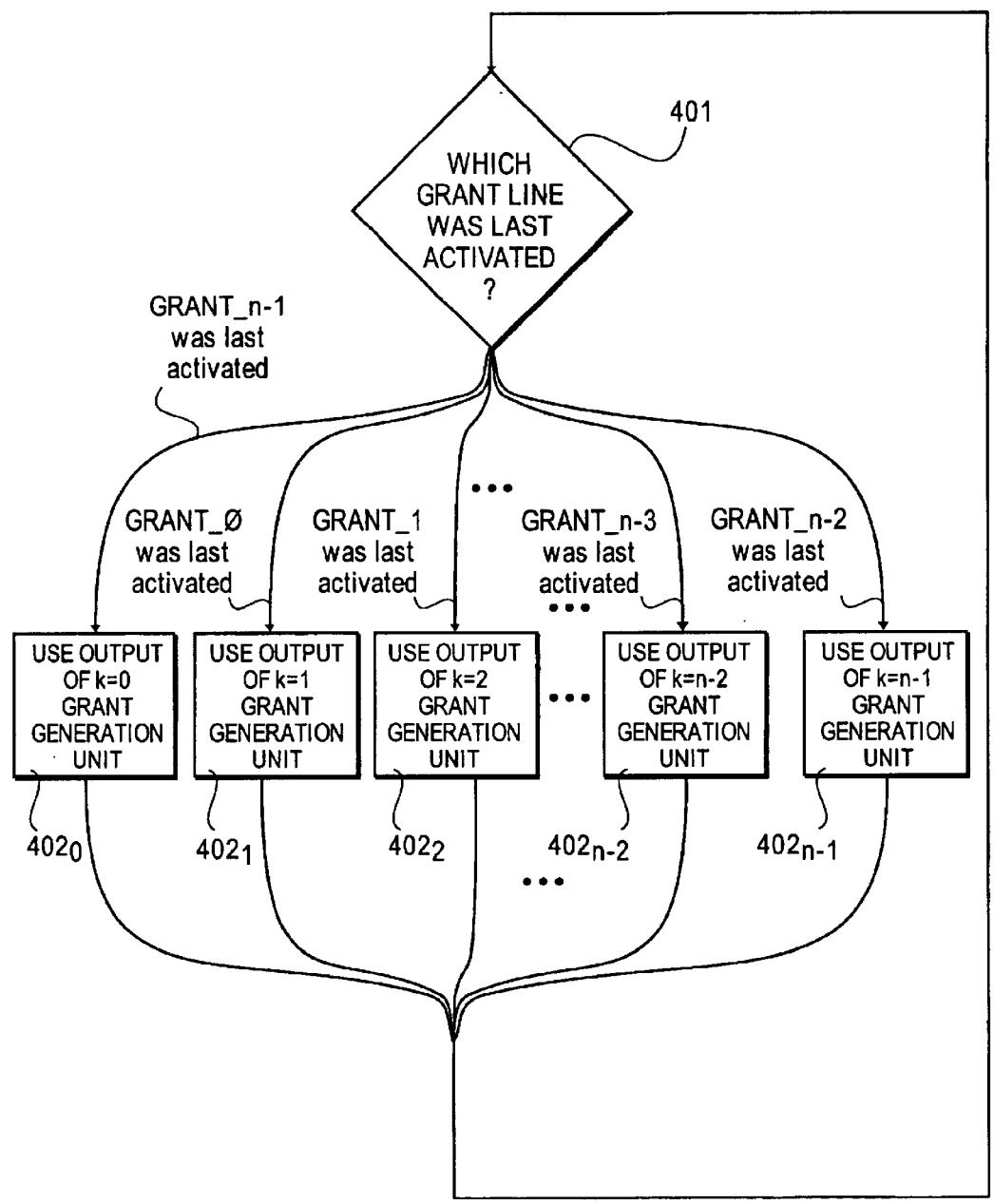

As grant eligibility can be determined by which request agent last received a grant (e.g., if request agent k=0 last received a grant, the next request agent to be grant eligible will be request agent k=1), the particular embodiment of FIG. 3a is designed to use a particular grant generation unit in response to which grant line was last activated. FIG. 4 shows a methodology 400 that illustrates this aspect in more detail.

Referring to FIGS. 3a and 4, according to the methodology of FIG. 4:

1) if the Grant_0 line $304_0$ was activated within the previous output vector, the k=1 grant generation unit $305_1$ is used to generate $402_1$ the next output vector;
2) if the Grant_1 line $304_1$ was activated within the previous output vector, the k=2 grant generation unit $305_2$ is used to generate $402_2$ the next output vector;
3) if the Grant_2 line $304_2$ was activated within the previous output vector, the k=3 grant generation unit $305_3$ is used to generate $402_3$ the next output vector;

. . .

n-2) if the Grant_n-3 line (not shown in FIG. 3a) was activated within the previous output vector, the k=n-2 grant generation unit $305_{n-2}$ is used to generate $402_{n-2}$ the next output vector;
n-1) if the Grant_n-2 line $304_{n-2}$ was activated within the previous output vector, the k=n-1 grant generation unit $305_{n-1}$ is used to generate $402_{n-1}$ the next output vector; and
n) if the Grant_n-1 line $304_{n-1}$ was activated within the previous output vector, the k=0 grant generation unit $305_0$ is used to generate $402_0$ the next output vector.

As seen in FIG. 3a, the output lines $304_0$ through $304_{n-1}$ are fedback so that the appropriate grant generation unit to be used for the generation of the next output vector can be determined. The fedback output lines $304_0$ through $304_{n-1}$ may be delayed by delay unit 310 so that the rate at which output vectors are formulated is controlled. Alternatively or in combination, the rate at which output vectors are formulated may depend upon a clock that helps time their presentation across output 304. The exact manner as to how the fed back output lines $304_0$ through $304_{n-1}$ are used to determine the appropriate grant generation unit may vary from embodiment to embodiment.

In the embodiment of FIG. 3a, a grant generation unit selector 307 is responsible for enabling an appropriate multiplexer 306 input channel in response to each output vector that is presented across the grant lines 304. That is, if the Grant_0 line $304_0$ was activated within the previous output vector, the second multiplexer input channel $306_1$ is enabled (so that the next output vector is provided by the k=1 grant generation unit $305_1$); if the Grant_1 line $304_1$ was activated within the previous output vector, the third multiplexer input channel $306_2$ is enabled (so that the next output vector is provided by the k=2 grant generation unit $305_2$), etc.

As such, the input to the grant generation unit selector 307 corresponds to the previous output vector (as presented at round robin control unit 304) shifted upwards by one bit. This automatically provides a "one hot" indication of the appropriate grant generation unit to use for the next output word. For example, if the previous output vector at output 304 corresponds to 00 . . . 001, the input vector presented to the grant generation unit 307 is 00 . . . 010.

In an embodiment, the grant generation unit selector 307 corresponds to a "one hot" to "binary" converter where the multiplexer 306 channel select input 311 accepts binary rather than a "one hot" input. Alternatively, the multiplexer 306 may be designed to accept a "one hot" formatted input (in which case the selector 307 can simply pass its input vector to the multiplexer 306). In other alternate embodiments, the function of the grant generation selection unit 307 may be built into the grant generation units themselves (e.g., in a distributed fashion) as observed in FIG. 3b.

Figure 3B:
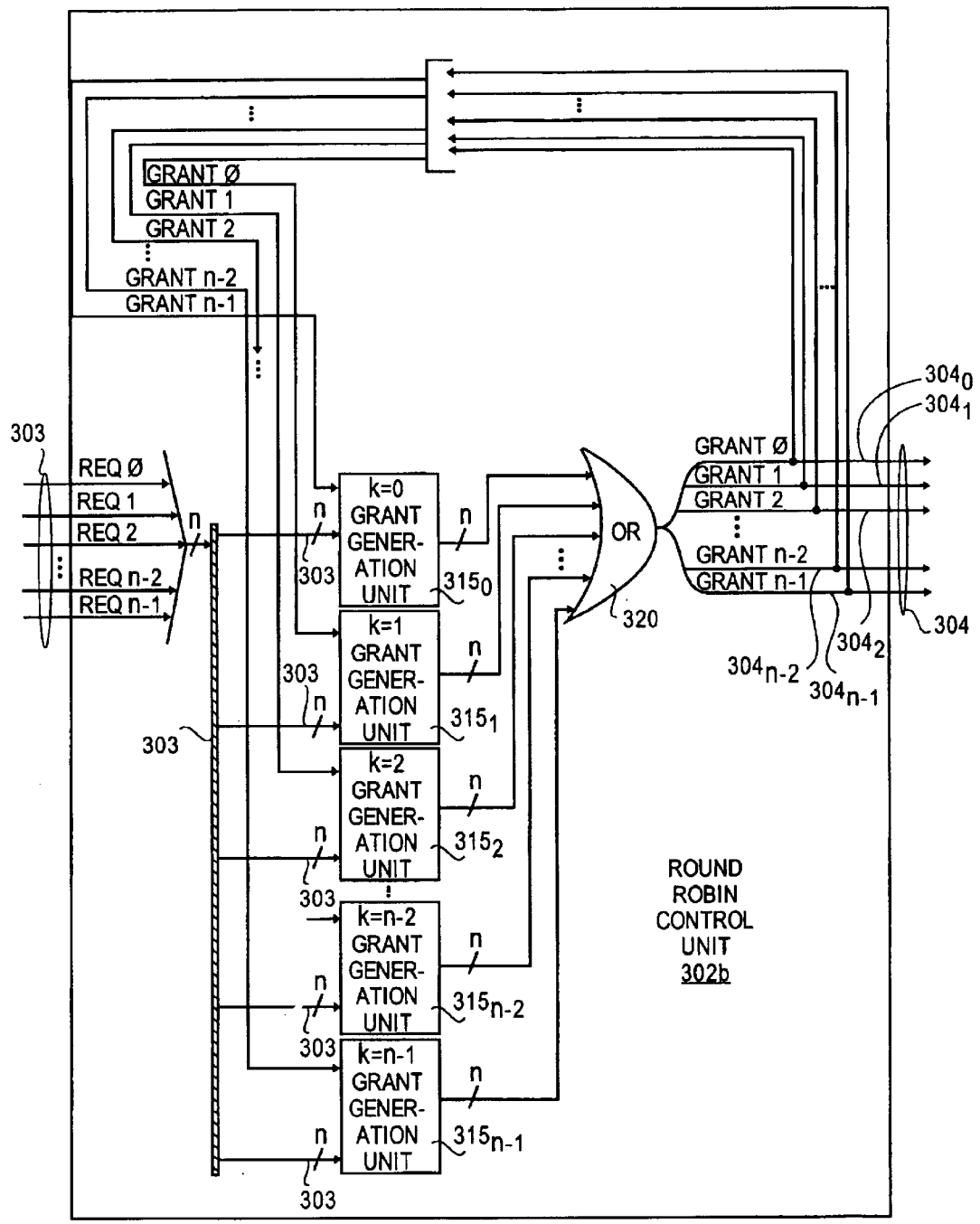
FIG. 3b shows another embodiment of the round robin control unit of FIG. 2.

In the embodiment of FIG. 3b, the input vector to the grant generation selection unit 307 (as drawn in FIG. 3a) is distributed across the collection of grant generation units $315_0$ through $315_{n-1}$. In this embodiment, the output lines $304_0$ through $304_{n-1}$ are routed in a feedback arrangement (i.e., "fedback") and used as individual enable lines. That is, the Grant_n-1 line $304_{n-1}$ is used as an enable line for the first grant generation unit $315_0$, the Grant_0 line $304_0$ is used as an enable line for the second grant generation unit $315_1$; the Grant_1 line $304_1$ is used as an enable line for the second grant generation unit $315_2$, etc.

In the embodiment of FIG. 3b, each non enabled grant generation unit produces a null vector (00 . . . 000) which presents no logical weight to the vector input OR gate 320 and is therefore ignored. As such, if the grant line presented to a particular grant generation unit is non active, the grant generation unit will have no effect on the output 304. As a result, the grant generation unit whose "enabling" input grant line was last activated will provide the next output vector 304 of the round robin control unit 302.

Figure 5A:
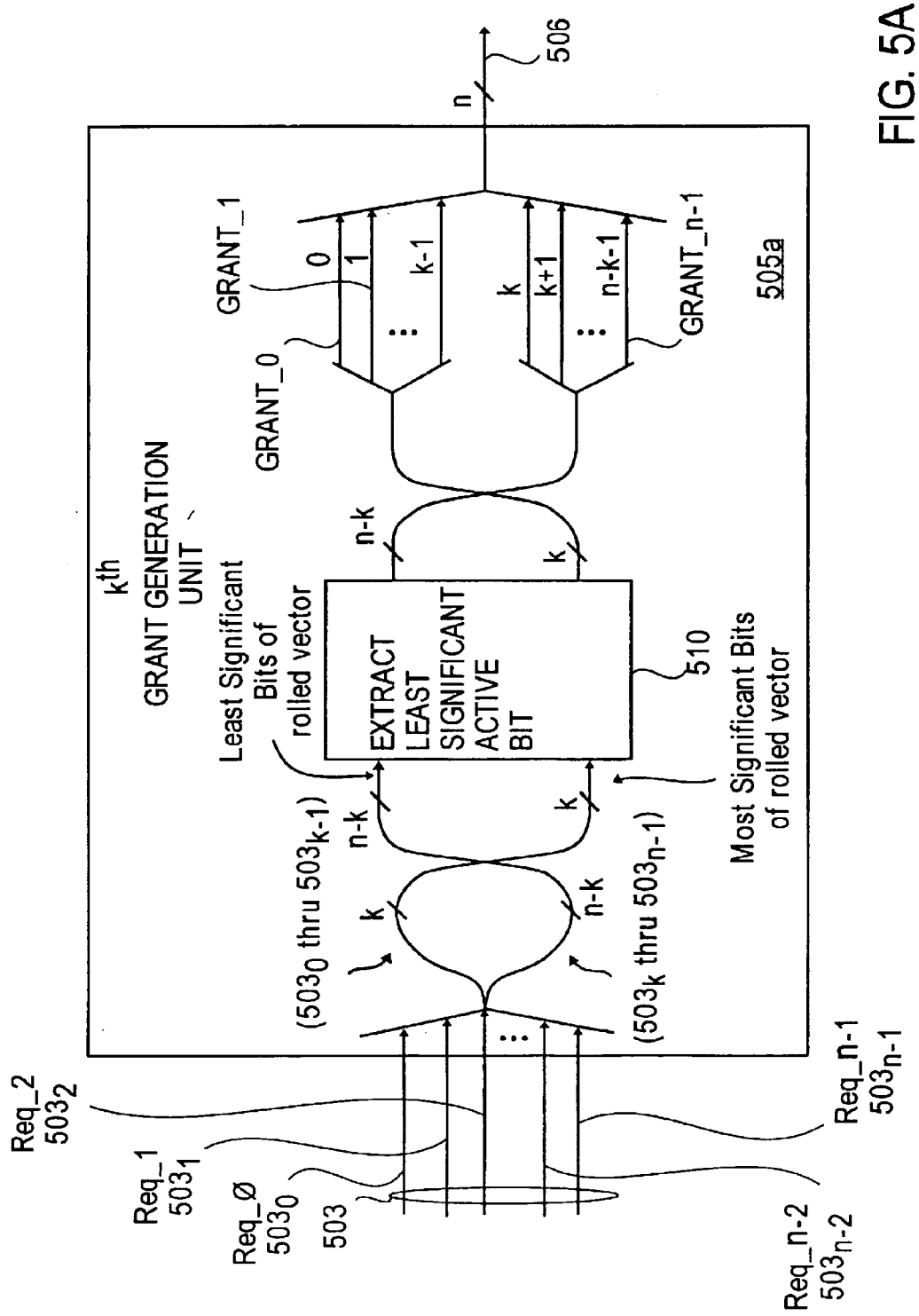
FIG. 5a shows an embodiment of a kth grant generation unit.

FIG. 5a shows an embodiment 505a of a kth grant generation unit that may be used for any of the grant generation units $305_0$ through $305_{n-1}$ of FIG. 3a. Recall that each of the grant generation units $305_0$ through $305_{n-1}$ of FIG. 3a have circuitry that produces an output vector of size n. As such, the output 506 of the grant generation unit 505a of FIG. 5a may be viewed as corresponding to any of the grant generation unit outputs $306_0$ through $306_{n-1}$ of FIG. 3a (depending on which grant generation unit of FIG. 3a the grant generation unit 505a of FIG. 5a corresponds to).

Referring to the round robin control unit 302 embodiment of FIG. 3a, note that each of the grant generation units $305_0$ through $305_{n-1}$ also receives an input vector 303 having size n. As such, the input 503 to the grant generation unit 505a embodiment of FIG. 5a is represented as an input vector of size n. Recall that the input vector corresponds to a vector of requests. For example, as discussed with respect to FIG. 2, the input vector 203 corresponds to a "one hot" vector of n requests where one request is reserved for each of queues $201_0$ through $201_{n-1}$.

More generally, referring to the embodiment of FIG. 5a, the input vector 503 may be viewed as a group of n individual requests for some type of service or access to resources that are contended for by a group of request agents. For example, the requests may correspond to requests for bandwidth resources; switching or routing resources (e.g., within a network or networking system); processing resources (e.g., within a computing network or computing system); or other types of services or resources not listed just above.

In the approach of FIG. 5a, the request input vector 503 is organized to reflect the grant eligibility hierarchy of the round robin cycle. That is, in the example of FIG. 5a, the least significant bit of the vector (Req_0 503$_0$) is from the first request agent to be recognized as grant eligible during a round robin cycle (e.g., queue 201$_0$ of FIG. 2); the next significant bit beyond the least significant bit of the vector (Req_1 503$_1$) is from the second element to be recognized as being grant eligible during a round robin cycle (e.g., queue 201$_1$), . . . the most significant bit (Req_n−1 503$_{n-1}$) is from the last request agent to be recognized as being grant eligible during a round robin cycle.

As a round robin cycle may be viewed as the continuous passing of grant eligibility to each request agent and the reaching of a disposition in response thereto, the grant generation unit 505a of FIG. 5a may be viewed as having a feature that manifests which request agent is being initially recognized as grant eligible and an element that reaches a disposition. Accordingly, with respect to FIG. 5a, the "rolled" [(n−k):k] vector represents the former and the least significant active bit extraction unit 510 represents the later.

More specifically, the input vector 503 is "rolled" such that the request agent being recognized as grant eligible is positioned as the least significant bit with respect to the input vector that is presented to the least significant active bit extraction unit 510. Recalling from the discussion of FIGS. 3a and 3b that the use of particular grant generation unit is triggered by its corresponding request agent (k) being recognized as grant eligible because the previous request agent in the round robin cycle (k−1) was just issued a grant, note that each grant generation unit 305$_0$ through 305$_{n-1}$ will have a different "rolled" vector topology in order to properly reflect the particular request agent that is being recognized as grant eligible.

Figure 6:
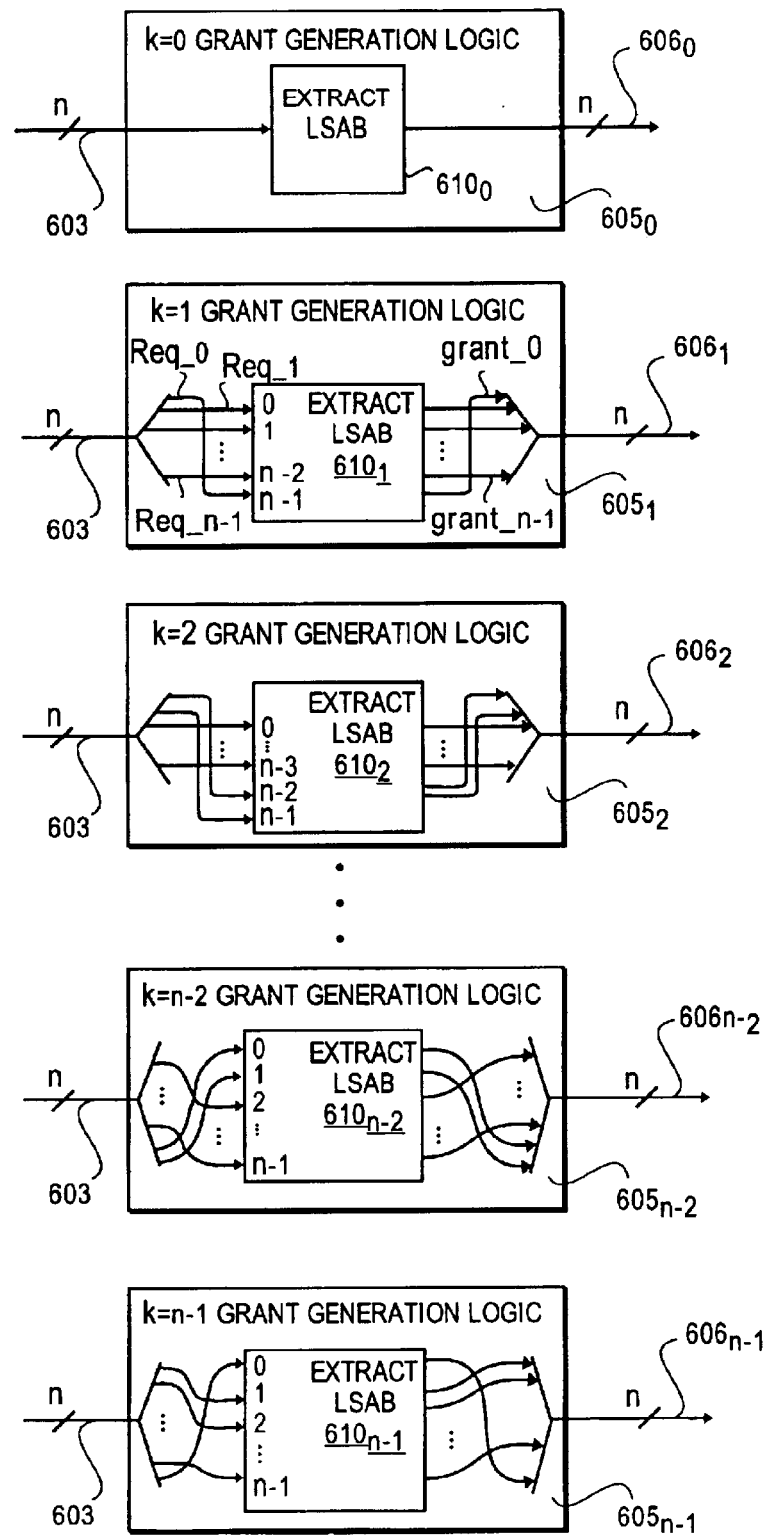
FIG. 6 shows an embodiment of a plurality of grant generation units over a range of k values.

FIG. 6 explores this in more detail. FIG. 6 shows an embodiment of the "rolled" input vector arrangements that may be used for each of the grant generation units 305$_0$ through 305$_{n-1}$ of FIG. 3. That is, grant generation units 605$_0$ through 605$_{n-1}$ of FIG. 6 correspond to, respectively, grant generation units 305$_0$ through 305$_{n-1}$ of FIG. 3a. As such, note that the "k" term in each grant generation unit corresponds to the request agent that is recognized as being grant eligible; and that the input vector 503 is rolled such that first k bits are placed in the most significant vector locations.

The rolling of the input vector causes the least significant bit presented to the least significant active bit extraction unit 510 as the input vector bit that was generated from the request agent being recognized as grant eligible. For example referring to FIG. 6, with respect to the first grant generation unit 605$_0$, the first request agent (k=0) is recognized as grant eligible. As such the input vector 603 is not rolled and the request value (whether active or not active) issued by the first request agent is the least significant bit that is presented to the least active significant bit extraction unit 610$_0$.

Similarly, with respect to the second grant generation unit 605$_1$, the second request agent (k=1) is recognized as grant eligible. As such the input vector 603 is rolled by one bit and the request value issued by the second request agent is the least significant bit that is presented to the least active significant bit extraction unit 610$_0$. Note that the request value issued by the first request agent becomes the most significant bit within the second grant generation unit 605$_1$ of FIG. 6.

The rolling of the input vector 603 continues in likewise fashion until, with respect to the last grant generation unit 605$_{n-1}$, the last request agent (k=n−1) is recognized as grant eligible. As such the input vector 603 is rolled by k−1 bits and the request value issued by the last request agent is the least significant bit that is presented to the least active significant bit extraction unit 610$_0$. Note that the request values issued by the first through next-to-last request agents (k=0 through k=n−2) become the most significant bits within the second grant generation unit 605$_1$ of FIG. 6.

Each of the least significant bit extraction units 610$_0$ through 610$_{n-1}$ are designed to extract the least significant active bit of the rolled input vector they are presented with. That is, as a few examples, if a positive logic rolled input vector corresponds to 11 . . . 111, a least significant bit extraction unit will emit an output vector of 00 . . . 001; or, if a positive logic rolled input vector corresponds to 11 . . . 110, a least significant bit extraction unit will emit an output vector of 00 . . . 010; or, if a rolled input vector corresponds to 10 . . . 000, the least significant bit extraction unit will emit an output vector of 10 . . . 000.

That is, as significance increases from right to left in the examples above, the least active significant bit extraction process may be viewed as effectively scanning the rolled input vector from the rightmost bit toward the left until an active bit is found. This bit corresponds to the least active bit of the rolled input vector. Once the least significant active bit is found, an output vector is created that presents the least active significant bit in an isolated fashion (thus ignoring active bits beyond the least significant active bit). Note that in actual implementations, the least significant bit extraction circuitry does not need to actually "scan" the rolled input vector. For example, basic combinatorial logic may be designed that simply passes forward the least significant bit.

The least significant bit extraction process effectively makes one or more grant dispositions over a region of the round robin cycle hierarchy. The region over which the dispositions originate starts with the request agent that is recognized as being grant eligible (i.e., the kth request agent) and ends with the first request agent at or beyond the kth request agent who is actively asserting a request. For example, if n=9 and the input vector 603 that is presented to the second (k=1) grant generation unit 605$_1$ is "100000101", the rolled input vector that is presented to the least significant active bit extraction unit 610$_1$ will be "110000010".

That is, in accordance with the manner in which the input vector 603 is rolled within the second grant generation unit 605$_1$ of FIG. 6, the first bit of input vector 603 is rolled from the least significant bit position (0) to the most significant bit position (n−1). In response to being presented with a "110000010" vector, the least significant active bit extraction unit 610$_1$ will provide at its output a "000000010" vector. Noting that this vector (i.e., that was just produced by the least significant active bit extraction unit 610$_1$) is rolled back to the original format of input vector 603 (e.g., is "unrolled" so that the round robin cycle hierarchy is preserved), the output vector 606$_1$ of the second grant generation unit 605$_1$ will be "000000100".

A few comments are in order from this example. Firstly, the rolling activity performed upon the input vector 603 effectively: 1) identifies which of the request agents is to be recognized as grant eligible within the framework of the round robin hierarchy; and, 2) builds the fairness of the round robin approach. Note that the status of the input vector 603 ("11000001") indicates that the first (k=0), third (k=2) and ninth (k=8) request agents are contending for resources. As the second grant generation unit $605_1$ is designed to operate after the first (k=0) request agent has been issued a grant, the positioning of the request from the second (k=1) request agent as the least significant bit (via the input vector 603 rolling process) effectively identifies the second request agent as being grant eligible.

Furthermore, note that the rolling of the request from the first request agent to the most significant bit effectively makes the first request agent "last in line" to receive the next grant. This corresponds to the fairness aspect of the round robin technique. That is, as the first resource agent has just received a grant, the remaining resource agents should be recognized as being grant eligible before the first resource agent is again recognized.

As a second observation, note that the least significant active bit extraction unit $610_1$ effectively makes a pair of dispositions for the second and third request agents. That is, after being presented with a vector of "110000010", the least significant active bit extraction unit $610_1$ effectively scans the vector from right to left in search of the first active bit that is presented. As the least significant bit corresponds to the request value issued by the second (k=1) request agent, the second request agent is, effectively, initially recognized as being grant eligible.

In this case, however, the least significant bit is inactive. That is, the second request agent is not requesting service. As such, the next request agent (i.e., the third (k=3) request agent) is effectively recognized as being grant eligible by scanning to the next significant bit. Here, the bit is found to be active. As such, the third (k=3) request agent is actively requesting service. Therefore, with the least significant active bit having been found, the least significant active bit extraction unit $610_1$ presents a vector of "0000000100". Thus, the least significant active bit extraction unit $610_1$ has effectively made a disposition for the second request agent (which resulted in a disposition that a grant should not be issued) and the third request agent (which resulted in a disposition that a grant should be issued).

The "000000010" vector produced by the least significant active bit extraction unit $610_1$ is then "unrolled" to form a "000000100" output vector at the output $606_1$ of the second grant generation unit $605_1$. This vector is then presented at the output 304 of the round robin control unit 302 (referring briefly back to FIG. 3a) which signifies that the third (k=2) request agent is being issued a grant. As such, the fourth (k=3) grant generation unit $305_3$ will provide the next output vector from the round robin control unit 302. Note that, consistent with the round robin hierarchy, the fourth (k=3) grant generation unit $305_3$ (as a result of its input vector rolling process) will initially identify the fifth (k=4) request agent as being grant eligible.

Figure 5B:
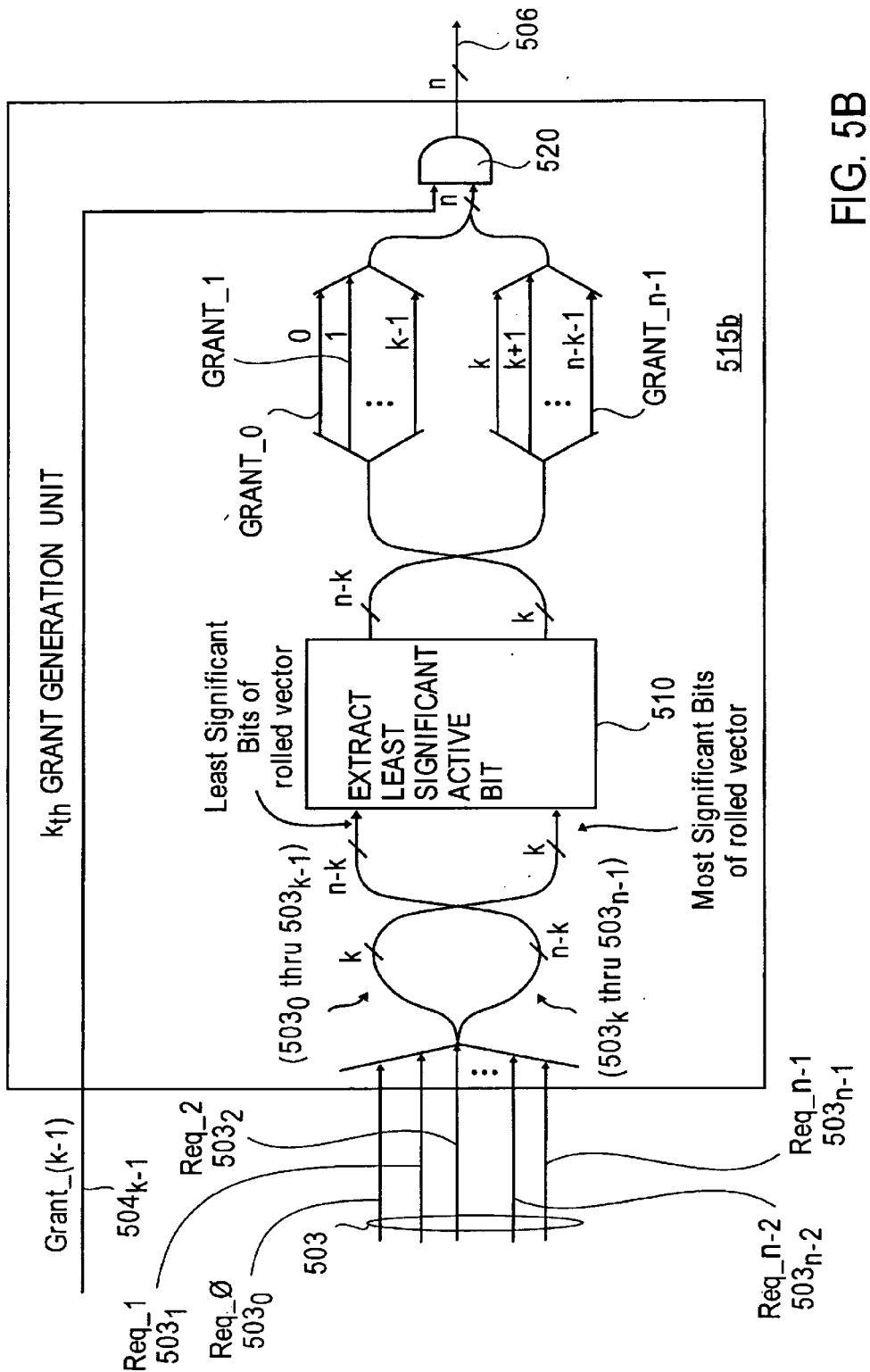
FIG. 5b shows another embodiment of a kth grant generation unit.

FIG. 5b shows an embodiment of a grant generation unit 515b that may be used for each of the grant generation units $515_0$ through $515_{n-1}$ of FIG. 3b. Note that the enabling input $504_{k-1}$ of FIG. 5b controls the output of the grant generation unit 515b. For example, as seen in FIG. 5b, the enabling input $504_{k-1}$ is individually ANDed with each bit from the "un-rolled" least significant bit extraction unit 510 output vector. Thus, if the enabling input $504_{k-1}$ is inactive (e.g., a "0"), the grant generation unit 515b produces a "null" vector (e.g., 00 . . . 000) where each bit in the output 506 is inactive. If the enabling input $504_{k-1}$ is active (e.g., a "1"), the grant generation unit 515b produces the "un-rolled" least significant bit extraction unit 510 output vector.

For simplicity, this operation has been drawn as a single AND gate 520 but, in actuality may be implemented as n AND gates having a first input tied to an un-rolled vector bit and a second input tied to the enabling input $504_{k-1}$. Lastly note that, consistent with the embodiment of FIG. 3b, the enabling input $504_{k-1}$ may correspond to $504n-1$ when k=0.

Discussion of Round Robin Circuit Design Implementation Embodiments

Behavioral and/or RTL descriptions (such as Verilog descriptions and VHDL descriptions) are commonly used to describe a digital circuit design. Typically, the behavioral level description of a circuit corresponds to a functional description of the operation of the circuit. The behavioral level description commonly resembles a software program because both (i.e., a behavioral level description and a software program) define a methodology or sequence of operations.

An RTL description is somewhat similar to a behavioral description (in that it resembles a software program) but also tends to include various hardware restrictions (such as the naming of nets on a bus, etc.). An RTL description is typically synthesized into a gate level netlist which describes the manner in which logic circuit elements (e.g., gates, registers, etc.) are to be interconnected together to form a semiconductor circuit that performs the methodology outlined in the behavioral level description. Other types of descriptions that have various characteristics of both behavioral and RTL level descriptions are also possible.

The following discussion describes various approaches as to how the round robin approaches discussed above can be implemented at an RTL level so that efficiencies are realized when gate level netlist is produced. FIG. 7 shows an embodiment 700 of an RTL level description that describes the operation of a round robin control unit that conforms to the embodiment 302b of FIG. 3b. In the embodiment of FIG. 7, an n=20 design is described. Each of the unique "prio" calls within description space 702 corresponds to a grant generation unit. As 20 prior calls are implemented within the embodiment of FIG. 7, 20 grant generation units may be created when the behavioral level description is compiled into a netlist (or manufactured into a semiconductor chip).

The "prio" subfunction that is being called in each of the prio calls 702 observed in FIG. 7 corresponds to an "extract least significant bit" function. As such, the input definitions to each of the prio calls 702 observed in FIG. 7 define the rolling of the input vector; and, the output definitions from each of the prio calls 702 observed in FIG. 7 define the "unrolling" of the vector that is produced by the least significant bit extraction process. Note also that each prior call includes an enabling input statement ".en(..)" that corresponds to the enabling input $504_{k-1}$ of FIG. 5b. Also, note that statement 703 corresponds to a large OR function which corresponds to the OR gate 320 observed in FIG. 3b.

FIG. 8 shows an embodiment of the "prio" subfunction referred to just above. As mentioned just above, the prio subfunction embodiment of FIG. 8 describes an "extract least significant bit" process. The methodology described in FIG. 8 effectively scans the input vector in a direction from least significance to most significance and defines the appropriate output value to be generated in response for each bit location in the vector as it is scanned. The first active bit discovered produces the corresponding output value.

FIG. 9 shows an embodiment that divides the scanning process into four parallel operations. That is, a first 5 bit section of the rolled input vector (4:0), a second 5 bit section of the rolled output vector (9:5), a third 5 bit section of the rolled input vector (14:10); and a fourth 5 bit section of the rolled output vector (19:15) are scanned in parallel. Each of these parallel operations are described in description spaces 901 through 904 respectively. Note that the least significant bit in each region (if any) is identified by each scanning process. Statement 905 calculates the proper output from the results of the parallel scanning operations.

Note that the use of commercially available synthesizers (e.g., Synopsis) have algorithms for reducing and simplifying logic implementations. Approaches similar to that of FIG. 8 (where the output is predefined from a serial scanning operation) have been found to consume logic gates when implemented; while approaches similar to FIG. 9 (where the output is calculated from a series of parallel scanning operations) have been found to exhibit less propagation delay. Note also that the synthesis process may create circuit implementations that vary from either of the approaches shown in FIG. 3*a* or 3*b*.

Additional Comments

It is also important to point out that the "one hot" encoding features of the above described round robin circuit embodiments and circuit design implementation embodiments may be converted to binary encoding at various locations where possible. For example, referring to FIG. 2, the round robin control unit 202 output 204 and/or input 202 may be binary encoded. Thus, the present discussion embraces embodimets other than those that are only "one hot" encoded.

Furthermore, note that a family of alternative embodiments can be created through the use of a "most significant bit extraction process" and an input vector rolling approach that rolls vectors in an opposite direction from that observed in FIGS. 5*a* and 5*b*. For example, a "one hot" vector can be scanned in a most significant to least significant direction (e.g., from left to right for a given input vector). As such, the most significant kth bits would be rolled to the least significant region of the vector (rather than having the least significant kth bits rolled toward the most significant region of the vector as described with respect to FIGS. 5*a*, 5*b* and 6). Embodiments that position the bit from the request agent (who is to be recognized as being grant eligible) somewhere between the most significant and least significant bits of the rolled input vector are also possible.

Note also that embodiments of the present description may be implemented not only within a semiconductor chip but also within machine readable media. For example, the designs discussed above may be stored upon and/or embedded within machine readable media associated with a design tool used for designing semiconductor devices. Examples include a netlist formatted in the VHSIC Hardware Description Language (VHDL) language, Verilog language or SPICE language. Some netlist examples include: a behaviorial level netlist, a register transfer level (RTL) netlist, a gate level netlist and a transistor level netlist. Machine readable media also include media having layout information such as a GDS-II file. Furthermore, netlist files or other machine readable media for semiconductor chip design may be used in a simulation environment to perform the methods of the teachings described above.

Thus, it is also to be understood that embodiments of this invention may be used as or to support a software program executed upon some form of processing core (such as the CPU of a computer) or otherwise implemented or realized upon or within a machine readable medium. A machine readable medium includes any mechanism for storing or transmitting information in a form readable by a machine (e.g., a computer). For example, a machine readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method, comprising:
   a) rolling a vector of request values to form a first rolled vector and a second rolled vector, said first rolled vector having a different amount of rolled request values than said second rolled vector, said request values provided by a plurality of request agents, a position within said first rolled vector being reserved for a request value that was provided by a first request agent, a position within said second rolled vector being reserved for a request value that was provided by a second request; and,
   b) if said first request agent is eligible for a grant in a round robin grant eligibility hierarchy:
      extracting a first active request value that is observed in said first rolled vector starting from said position within said first rolled vector and extending in a direction toward a request value provided by a next request agent to be recognized as being grant eligible within said eligibility hierarchy;
   if said first request agent is not eligible for a grant in said round robin eligibility hierarchy:
      extracting a first active request value that is observed in said second rolled vector starting from said position within said second rolled vector and extending in a direction toward a request value provided by a next request agent to be recognized as being grant eligible within said eligibility hierarchy.

2. The method of claim 1 wherein said position is the least significant position.

3. The method of claim 2 further comprising scanning said rolled vector for said first active request value, said scanning starting at said position.

4. The method of claim 3 further comprising issuing a grant to that request agent of said request agents whose request corresponds to said active request value.

5. The method of claim 1 wherein said position is the most significant position.

6. The method of claim 5 further comprising scanning said rolled vector for an active request value, said scanning starting at said position.

7. The method of claim 6 further comprising issuing a grant to that request agent of said request agents whose request corresponds to said active request value.

8. The method of claim 1 wherein said grant is a grant for bandwidth resources.

9. The method of claim 1 wherein said grant is a grant for routing resources.

10. The method of claim 1 wherein said grant is a grant for switching resources.

11. The method of claim 1 wherein said grant is a grant for processing resources.

12. The method of claim 1 wherein said extracted first active request value is first provided in an output vector arranged as said rolled vector is arranged.

13. The method of claim 12 further comprising un-rolling said output vector so as to produce a second output vector arranged as said vector of request values is arranged.

14. An apparatus, comprising:
a first bit extraction unit that receives a first rolled vector of request values, said request values provided by a plurality of request agents, said first bit extraction unit designed to extract a first active bit observed in said first rolled vector, if said first rolled vector has request value that was provided by a request agent that is to be recognized as being grant eligible positioned at an end position of said first rolled vector, starting from said end position and extending in a direction toward a request value that is to be recognized as a request from a next request agent to be recognized as being grant eligible within said eligibility hierarchy; and,
a second bit extraction unit that receives a second rolled vector of said request values, said second rolled vector having a different amount of rolled request values as compared to said first rolled vector, said second bit extraction unit designed to extract a first active bit observed in said second rolled vector, if said second rolled vector has a request value that was provided by a request agent that is to be recognized as being grant eligible positioned at an end position of said second rolled vector, starting from said end position of said second rolled vector and extending in a direction toward a request value that is to be recognized as a request from a next request agent to be recognized as being grant eligible within said eligibility hierarchy.

15. The apparatus of claim 14 wherein said end position of said first rolled vector is the least significant position.

16. The apparatus of claim 15 wherein said bit extraction unit scans said rolled vector for an active bit, said scanning starting at said end position of first rolled vector.

17. The apparatus of claim 14 wherein said end position of said first rolled vector is the most significant position.

18. The apparatus of claim 17 wherein said bit extraction unit scans said rolled vector for an active request value, said scanning starting at said end position of said first rolled vector.

19. A method, comprising:
choosing, from a plurality of grant generation units, a grant generation unit that is to provide an output specifying which request agent, from a plurality of request agents, is to receive a grant; wherein said plurality of grant generation units are arranged according to a round robin grant eligibility hierarchy, such that, one grant generation unit exists for each request agent; and wherein said chosen grant generation unit is chosen because its corresponding request agent is the next request agent in said round robin grant eligibility hierarchy to be recognized as being eligible for a grant.

20. The method of claim 19 further comprising providing an input vector of request values to said grant generation unit, said request values generated by said request agents.

21. The method of claim 20 further comprising rolling said input vector, said rolling of said vector resulting in a rolled vector that reflects said round robin grant eligibility hierarchy and wherein a position within said rolled vector is reserved for a request value that was provided by said corresponding request agent.

22. The method of claim 21 further comprising extracting a first active request value that is observed in said rolled vector, starting from said position and extending in a direction toward a request value that is to be recognized as a request from a next request agent to be recognized as being grant eligible within said eligibility hierarchy.

23. The method of claim 22 wherein said position is the least significant position.

24. The method of claim 23 further comprising scanning said rolled vector for said first active request value, said scanning starting at said position.

25. The method of claim 22 wherein said position is the most significant position.

26. The method of claim 25 further comprising scanning said rolled vector for an active request value, said scanning starting at said position.

27. The method of claim 22 further comprising issuing a grant to that request agent of said request agents whose request corresponds to said active request value.

28. The method of claim 27 wherein said grant is a grant for bandwidth resources.

29. The method of claim 27 wherein said grant is a grant for routing resources.

30. The method of claim 27 wherein said grant is a grant for switching resources.

31. The method of claim 27 wherein said grant is a grant for processing resources.

32. The method of claim 22 wherein said extracted first active request value is first provided in an output vector arranged as said rolled vector is arranged.

33. The method of claim 32 further comprising un-rolling said output vector so as to produce a second output vector arranged as said vector of request values is arranged.

34. An apparatus, comprising:
a plurality of grant generation units, wherein said plurality of grant generation units are arranged according to a round robin grant eligibility hierarchy, such that, one grant generation unit exists for each of a plurality of request agents; and wherein a grant generation unit is chosen to provide an output specifying which request agent, from said plurality of request agents is to receive a grant, said chosen grant generation unit being chosen because its corresponding request agent is the next request agent in said round robin grant eligibility hierarchy to be recognized as being eligible for a grant.

35. The apparatus of claim 34 wherein each of said grant generation units receive an input vector of request values.

36. The apparatus of claim 35 wherein each of said grant generation units roll said input vector to form a rolled vector, said rolled vector reflecting said round robin grant eligibility hierarchy and wherein a position within said rolled vector is reserved for a request value that was provided by the corresponding request agent for each of said grant generation units.

37. The apparatus of claim 36 wherein each of said grant generation units further comprise a bit extraction unit that extracts a first active request value that is observed in said rolled vector, starting from said position and extending in a direction toward a request value that is to be recognized as a request from a next request agent to be recognized as being grant eligible within said eligibility hierarchy.

38. The apparatus of claim 37 wherein said position is the least significant position.

39. The apparatus of claim 38 wherein said position is the most significant position.

40. The apparatus of claim 34 wherein said grant is for bandwidth resources.

41. The apparatus of claim 37 wherein each of said grant generation units provide their said extracted first active request value in an output vector arranged as said rolled vector is arranged.

42. The apparatus of claim 41 wherein each of said grant generation units un-roll their said output vector so as to produce a second output vector arranged as said vector of request values is arranged.

43. The apparatus of claim 34 wherein said grant is a grant for bandwidth resources.

44. The apparatus of claim 34 wherein said grant is a grant for routing resources.

45. The apparatus of claim 34 wherein said grant is a grant for switching resources.

46. The apparatus of claim 34 wherein said grant is a grant for processing resources.

47. A machine readable medium having stored thereon a description of a circuit, said circuit comprising:
   a first bit extraction unit that receives a first rolled vector of request values, said request values provided by a plurality of request agents, said first bit extraction unit designed to extract a first active bit observed in said first rolled vector, if said first rolled vector has request value that was provided by a request agent that is to be recognized as being grant eligible positioned at an end position of said first rolled vector, starting from said end position and extending in a direction toward a request value that is to be recognized as a request from a next request agent to be recognized as being grant eligible within said eligibility hierarchy; and,
   a second bit extraction unit that receives a second rolled vector of said request values, said second rolled vector having a different amount of rolled request values as compared to said first rolled vector, said second bit extraction unit designed to extract a first active bit observed in said second rolled vector, if said second rolled vector has a request value that was provided by a request agent that is to be recognized as being grant eligible positioned at an end position of said second rolled vector, starting from said end position of said second rolled vector and extending in a direction toward a request value that is to be recognized as a request from a next request agent to be recognized as being grant eligible within said eligibility hierarchy.

48. The machine readable medium of claim 47 wherein said end position of said first called vector is the least significant position.

49. The machine readable medium of claim 48 wherein said bit extraction unit scans said rolled vector for an active bit, said scanning starting at said end position of said first rolled vector.

50. The machine readable medium of claim 47 wherein said end position of said first rolled vector is the most significant position.

51. The machine readable medium of claim 50 wherein said bit extraction unit scans said rolled vector for an active request value, said scanning starting at said end position of said first rolled vector.

52. A machine readable medium having stored thereon a description of circuit, said description of a circuit comprising:
   a plurality of grant generation units, wherein said plurality of grant generation units are arranged according to a round robin grant eligibility hierarchy, such that, one grant generation unit exists for each of a plurality of request agents; and wherein a grant generation unit is chosen to provide an output specifying which request agent, from said plurality of request agents is to receive a grant, said chosen grant generation unit being chosen because its corresponding request agent is the next request agent in said round robin grant eligibility hierarchy to be recognized as being eligible for a grant.

53. The machine readable medium of claim 52 wherein each of said grant generation units receive an input vector of request values.

54. The machine readable medium of claim 53 wherein each of said grant generation units roll said input vector to form a rolled vector, said rolled vector reflecting said round robin grant eligibility hierarchy and wherein a position within said rolled vector is reserved for a request value that was provided by the corresponding request agent for each of said grant generation units.

55. The machine readable medium of claim 54 wherein each of said grant generation units further comprise a bit extraction unit that extracts a first active request value that is observed in said rolled vector, starting from said position and extending in a direction toward a request value that is to be recognized as a request from a next request agent to be recognized as being grant eligible within said eligibility hierarchy.

56. An apparatus, comprising:
   a round robin control unit having an input bus to receive a vector of requests from a plurality of request agents, said round robin control unit having an output bus to provide a vector that identifies which particular one of said request agents is to be considered as being provided a grant, said round robin control unit comprising a plurality of grant generation units, each grant generation unit uniquely coupled to said input bus so as to receive its own unique arrangement of said vector of requests, each grant generation output coupled to said output bus, the number of said grant generation units being equal to the number of said request agents.

* * * * *